United States Patent [19]

Cogan et al.

[11] Patent Number: 4,551,909
[45] Date of Patent: Nov. 12, 1985

[54] METHOD OF FABRICATING JUNCTION FIELD EFFECT TRANSISTORS

[75] Inventors: Adrian I. Cogan, Waltham; Izak Bencuya, Needham, both of Mass.

[73] Assignee: GTE Laboratories Incorporated, Waltham, Mass.

[21] Appl. No.: 594,613

[22] Filed: Mar. 29, 1984

[51] Int. Cl.$^4$ ................................... H01L 21/265
[52] U.S. Cl. .................... 29/571; 29/576 B; 148/187
[58] Field of Search ........... 29/571, 576 B; 148/187, 148/1.5

[56] References Cited

U.S. PATENT DOCUMENTS

| | | | |
|---|---|---|---|
| 3,828,230 | 8/1974 | Nishizawa et al. | 357/22 |
| 4,199,771 | 4/1980 | Nishizawa et al. | 357/22 |
| 4,406,052 | 9/1983 | Cogan | 29/576 B |
| 4,437,925 | 3/1984 | Cogan | 148/187 X |
| 4,442,589 | 4/1984 | Doo et al. | 148/187 X |
| 4,449,284 | 5/1984 | Shimbo | 148/187 X |
| 4,477,963 | 10/1984 | Cogan | 148/187 X |
| 4,497,107 | 2/1985 | Cogan | 148/187 X |

OTHER PUBLICATIONS

Cogan et al., Proceedings of the International Electron Devices Meeting (IEEE), Dec. 5–7, 1983, Wn., D.C., Paper 95, pp. 221–224.

Primary Examiner—George T. Ozaki
Attorney, Agent, or Firm—David M. Keay

[57] ABSTRACT

Junction field effect transistor, specifically a static induction transistor, and method of fabricating. A low resistivity N-type surface layer is formed at the surface of a high resistivity N-type epitaxial layer which has been grown on a low resistivity N-type substrate of silicon. The surface of the surface layer is coated with silicon dioxide and portions of the silicon dioxide layer are removed to expose alternating gate surface areas and source surface areas. P-type conductivity material is diffused into the silicon from the gate surface areas to produce zones of graded concentration. The difference in concentration of N-type conductivity imparting material in the surface layer and in the remainder of the epitaxial layer causes the resulting P-type gate regions to extend laterally toward each other so as to produce narrow channel regions at a depth beyond the surface layer while limiting the lateral extensions of the P-type gate regions adjacent to the surface. The device exhibits both high voltage gain and low gate capacitance.

10 Claims, 4 Drawing Figures

PRIOR ART

METHOD OF FABRICATING JUNCTION FIELD EFFECT TRANSISTORS

BACKGROUND OF THE INVENTION

This invention relates to semiconductor devices. More particularly, it is concerned with junction field effect transistors of the static induction type and to methods of fabrication.

The static induction transistor is a field effect semiconductor device capable of operation at relatively high frequency and power. The transistors are characterized by a short, high resistivity semiconductor channel region which may be controllably depleted of carriers. The current-voltage characteristics of the static induction transistor are generally similar to those of a vacuum tube triode. These devices are described by Nishizawa et al. in U.S. Pat. No. 3,828,230 issued Aug. 6, 1974, and in U.S. Pat. No. 4,199,771 issued Apr. 22, 1980. See also an article entitled "High Performance Microwave Static Induction Transistors" by Cogan et al published in the proceedings of the International Eectron Devices Meeting (IEEE) Dec. 5, 6, and 7, 1983, Washington, D.C., Paper 9.5, Page 221.

The static induction transistor generally uses vertical geometry with source and drain electrodes placed on opposite sides of a thin, high resistivity layer of one conductivity type. Gate regions of opposite conductivity type are positioned in the high resistivity layer on opposite sides of the source. During operation a reverse bias is applied between the gate region and the remainder of the high resistivity layer causing a depletion region to extend into the channel region below the source. As the magnitude of the reverse bias is varied, the source-drain current and voltage derived from an attached energy source will also vary.

One factor which limits the operation of static induction transistors at high frequency is gate capacitance. In order to obtain high voltage gain the gate junction must be located in the immediate vicinity of the source. A very short gate-to-source distance, however, causes the gate capacitance to be high. In addition, a short gate-to-source distance requires extremely tight tolerances and process control during device fabrication.

SUMMARY OF THE INVENTION

The method of fabricating a junction field effect transistor in accordance with the present invention provides an improved method of obtaining a high gain, low gate capacitance static induction transistor without requiring tight tolerances during fabrication.

The method in accordance with the present invention comprises providing a body of semiconductor material which includes a substrate of semiconductor material of one conductivity type of relatively low resistivity and a layer of semiconductor material of the one conductivity type of relatively high resistivity contiguous said substrate, the layer having a surface at a surface of the body. Conductivity type imparting material of the one conductivity type is introduced into the layer of semiconductor material from the surface to form a surface layer of semiconductor material of the one conductivity type of relatively low resistivity adjacent to the surface and an underlying layer of semiconductor material of the one conductivity type of relatively high resistivity between the surface layer and the substrate. A layer of a protective material is formed adherent to the surface of the body. Portions of the layer of protective material are removed to expose alternating gate surface areas and source surface areas in the surface. Conductivity type imparting material of the opposite conductivity type is introduced into the surface and underlying layers from the gate surface areas to produce zones of graded concentration of conductivity type imparting material of the opposite conductivity type. The highest concentration of the conductivity type imparting material of the opposite conductivity type is adjacent to the gate surface areas. Since the surface layer is of lower resistivity than the underlying layer and thus has a higher concentration of conductivity type imparting material of the one conductivity type, the conductivity type imparting material of the opposite conductivity type in the graded zone converts portions of the surface layer to the opposite conductivity type only where the concentration of conductivity type imparting material of the opposite conductivity type is relatively high. Thus, gate regions of the opposite conductivity type are formed which extend from the gate surface areas for a greater distance into the underlying layer than into the surface layer. Conductivity type imparting material of the one conductivity type is then introduced into the surface layer from the source surface areas to produce source regions of the one conductivity type of lower resistivity at the source surface areas. Conductive material is applied to form electrical contacts in ohmic contact with the source and gate regions at the source and gate surface areas, respectively.

A junction field effect transistor in accordance with the present invention comprises a body of semiconductor material having a surface layer of semiconductor material of one conductivity type of relatively low resistivity and an underlying layer of semiconductor material of the one conductivity type of relatively high resistivity contiguous the surface layer, the surface layer having a surface in the surface of the body. A layer of protective material adherent to the surface has openings therein at alternating gate surface areas and source surface areas of the surface. A zone containing conductivity type imparting material of the opposite conductivity type is inset in the surface and underlying layers at each of the gate surface areas. Each zone has a graded concentration of conductivity type imparting material of the opposite conductivity type with the highest concentration adjacent to the gate surface areas. Thus, gate regions of the opposite conductivity type are provided which extend from the gate surface areas for a greater distance into the underlying layer than into the surface layer by virtue of the higher concentration of conductivity type imparting material of the one conductivity type in the surface layer. A gate contact member is in ohmic contact with the semiconductor material of the opposite conductivity type at each of the gate surface areas, and a source contact member is in ohmic contact with the semiconductor material of the one conductivity at each of the source surface areas.

BRIEF DESCRIPTION OF THE INVENTION

In the drawings:

FIG. 1 is an elevational view in cross section of a fragment of a wafer of semiconductor material illustrating a portion of a junction field effect transistor of the static induction type of prior art construction; and FIGS. 2 through 4 are a series of elevational views in cross section of a fragment of a wafer of semiconductor material illustrating successive steps in the fabrication of a junction field effect transistor of the static induction type in accordance with the present invention.

In the figures the various elements are not drawn to scale. Certain dimensions are exaggerated in relation to other dimensions in order to present a clearer understanding of the invention.

For a better understanding of the present invention, together with other and further objects, advantages, and capabilities thereof, reference is made to the following discussion and appended claims in connection with the above described drawings.

DETAILED DESCRIPTION OF THE INVENTION

Figure 1:
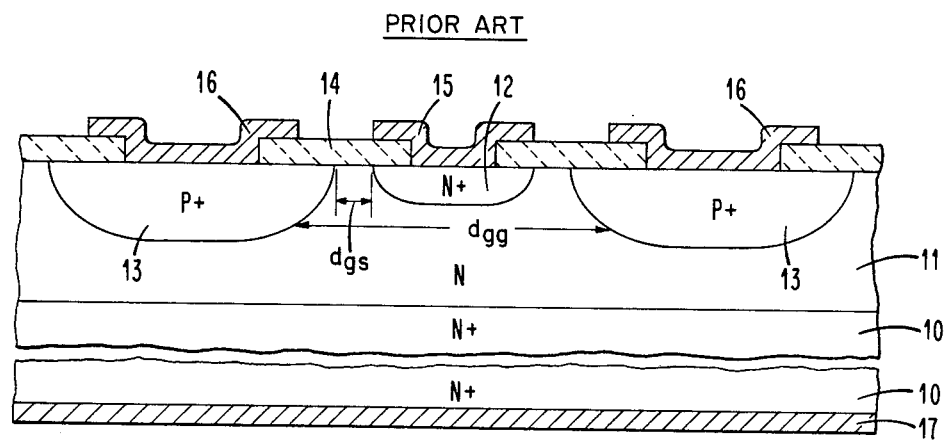
Figure 2:
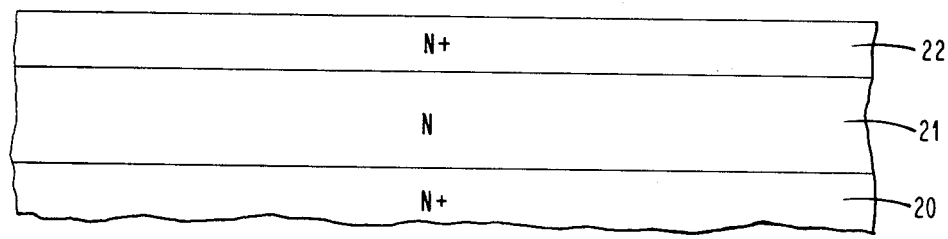
Figure 3:
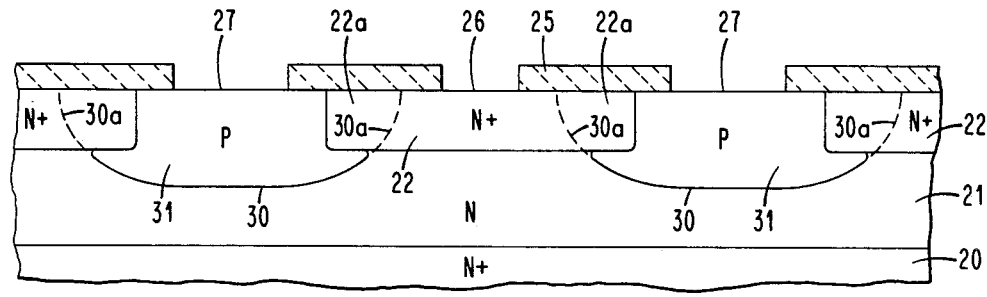
Figure 4:
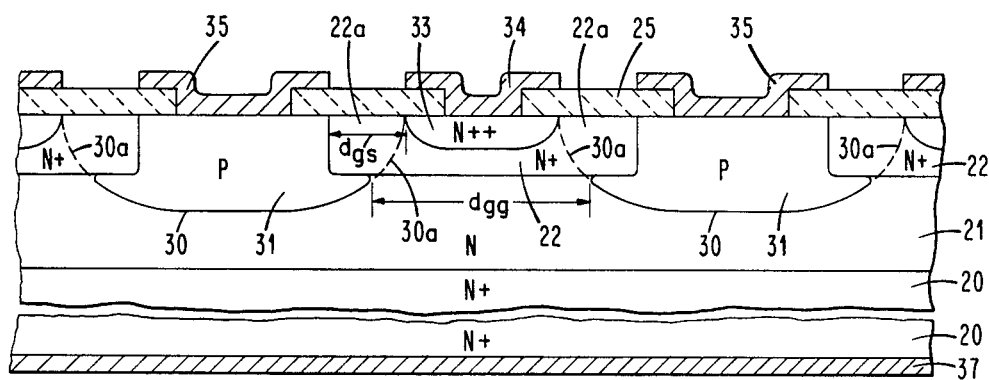

In fabricating junction field effect transistors of the static induction type in accordance with the prior art device illustrated in FIG. 1 and in accordance with the present invention as illustrated in FIGS. 2 through 4 a substrate of single crystal semiconductor material of one conductivity type is provided as a supporting structure. As is well understood the substrate is usually a slice or wafer of relatively large surface area upon which many identical devices are fabricated simultaneously. However, for purposes of illustration the fabrication of only a portion of a single static induction transistor in a fragment of a slice is shown and described. In the following description silicon is employed as the semiconductor material and the substrate is of relatively low resistivity N-type conductivity.

A junction field effect transistor of the static induction type of prior art construction is illustrated in FIG. 1. The device is fabricated on a substrate 10 of low resistivity N-type silicon. An epitaxial layer 11 of relatively high resistivity is grown on the substrate. Inset in the epitaxial layer 11 from the surface are alternating source regions 12 of N-type conductivity of low resistivity and P-type gate regions 13. As is well known the surface of the epitaxial layer 11 is coated with an adherent layer of silicon dioxide 14 having openings therein over the source and gate regions to which source and gate contact members 15 and 16, respectively, make ohmic contact. A drain contact member 17 is in ohmic contact with the substrate 10 at the bottom surface. Typically, the the P-type gate regions 13 are formed by the diffusion of P-type conductivity type imparting material into the epitaxial layer 11 from the surface. Therefore, the gate regions 13 have a configuration somewhat as represented in FIG. 1. As is well understood the flow of current from the source 12 to the drain 17 is controlled by the voltage applied to the gate regions 13 which causes a depletion region to form across the channel. In order to obtain high gain, that is, the control of a maximum amount of current flow from source to drain with a minimum amount of voltage applied to the gate regions, the channel width $d_{gg}$ between the gate regions 13 must be relatively small. The fabrication of a device as shown in FIG. 1 with a short channel width $d_{gg}$ necessarily produces a small gate-to-source distance $d_{gs}$. The smaller the gate-to-source distance $d_{gs}$, however, the greater the gate-to-source capacitance. As indicated hereinabove the greater the gate-to-source capacitance the less the efficiency of operation of the device at high frequencies.

Various stages in the fabrication of a static induction transistor in accordance with the invention are illustrated by FIGS. 2 through 4. A slice or wafer of N-type silicon of uniform low resistivity having flat, planar, parallel opposed major surfaces, a fragment 20 of which is shown in FIG. 2, is produced by any of the known techniques of crystal fabrication including appropriate slicing and cleaning operations.

An epitaxial layer 21 of N-type silicon of uniform relatively high resistivity is grown on the surface of the substrate as by known vapor deposition techniques. A layer 21 which is precisely controlled as to thickness and as to resistivity and which is a continuation of the crystalline structure of the single crystal substrate 20 is thus deposited on the surface of the substrate. The upper surface of the epitaxial layer 21 is parallel to the interface between the substrate and the layer.

The wafer is treated in accordance with conventional techniques to implant N-type conductivity type imparting material, for example arsenic, into a layer at the surface of the epitaxial layer 21 to form a surface layer 22 heavily doped with the N-type conductivity type imparting material.

Next, as illustrated in FIG. 3, the surface of the wafer is covered with an adherent protective layer of silicon dioxide 25. Portions of the layer of silicon dioxide 25 are removed by employing known photoresist masking and etching procedures to expose alternating source surface areas 26 and gate surface areas 27 at the surface of the wafer. As will be apparent from further discussion herein, this procedure defines both the source regions and the gate regions simultaneously eliminating problems of precise alignment during later processing steps.

The source surface areas 26 are protected as with a layer of photoresist material so that only the gate surface areas 27 remain exposed. P-type conductivity imparting material, for example boron, is then introduced into the wafer at the exposed gate surface areas 27 by conventional ion implantation techniques. The protective photoresist material is removed, and the wafer is heated to cause the implanted P-type conductivity imparting material to diffuse into the epitaxial layer 21 from the gate surface areas 27.

As a result of the implantation and subsequent heating, the P-type conductivity imparting material diffuses into a zone of graded concentration which is indicated in FIG. 3 by a line 30 and a dashed line extension 30a thereof. As is well understood, the distribution of the P-type conductivity imparting material varies from a highest concentration adjacent to the gate surface areas 27 to a lowest concentration adjacent to the line 30 and dashed line 30a. In the region in which the concentration of the P-type conductivity imparting material is greater than the concentration of the N-type conductivity imparting material a P-type region 31 is produced. Since the N-type surface layer 22 of low resistivity has a higher concentration of N-type conductivity imparting material than does the underlying remainder of the epitaxial layer 21, portions 22a of the N-type surface layer 22, although lying within the diffused zone defined by lines 30 and 30a, contain too high a concentration of N-type conductivity imparting material to become converted to P-type and thus remain N-type. The P-type gate regions 31 thus extend from the gate surface areas 27 for a greater distance into the underlying layer than into the surface layer 22 and have a general configuration as shown in FIG. 3.

After the P-type conductivity type imparting material has been diffused into the wafer, the gate surface areas 27 are appropriately protected and a shallow, heavily doped N-type source region 33 is formed by ion implantation at each of the source surface areas 26 as illustrated in FIG. 4. The protection is removed from the gate surface areas 27 and a layer of metal, specifically aluminum, is applied to the entire surface of the wafer. The metal layer is then appropriately masked and etched to provide source and gate contact members 34 and 35 in ohmic contact with the source and gate regions 33 and 31 at the source and gate surface areas 26 and 27, respectively. The source contacts 34 are appropriately connected together and to a source bonding pad (not shown), and the gate contacts 35 are appropriately connected together and to a gate bonding pad (not shown) in a conventional manner. A metal layer 37 is applied to the bottom surface of the substrate 20 in order to provide a suitable drain contact member.

In the fabrication of an exemplary static induction transistor structure in accordance with the present invention, the substrate 20 may be a slice of single crystal N-type silicon doped with antimony to produce a uniform resistivity of 0.01 to 0.05 ohm-centimeters. The N-type epitaxial layer 21 of relatively high resistivity silicon is doped with arsenic during deposition to provide a uniform resistivity of about 10 ohm-centimeters. The epitaxial layer 21 may be about 10 micrometers thick. Arsenic is implanted by ion implantation to produce the relatively low resistivity N-type surface layer 22 approximately 1 micrometer thick. The surface layer 22 has a resistivity of approximately 2 ohm-centimeters with an arsenic concentration of about $2.5 \times 10^{15}$ atoms/cm$^2$. The diffused zones are produced by implanting boron to a concentration of $5 \times 10^{15}$ atoms/cm$^2$ and subsequently diffusing. The width $d_{gg}$ of the channel region between the lateral extensions of the gate regions 31 is 3 micrometers. The distance $d_{gs}$ between the source region 33 and the gate region 31 at the narrowest point is 0.5 micrometer.

As illustrated by the portion of the final device illustrated by FIG. 4, the static induction transistor as fabricated in accordance with the foregoing method has a gate-to-source distance $d_{gs}$ together with a channel width $d_{gg}$ such as to provide high gain with low gate-to-source capacitance. The specific configuration of gate region 31 at the portion of the P-N junction between the gate region 31 and the unconverted portion 22a of the surface layer 22 depends upon various factors including the concentration profile and depth of surface layer 22. Alternatively, if the N-type surface layer 22 is of graded concentration by virtue of having been formed by diffusion, the shape of the portion of the P-N junction between the gate region 31 and the unconverted portion 22a of the surface layer 22 differs from that formed if the concentration in the surface layer 22 is uniform. Thus by controlling the appropriate factors, the shape of that portion of the P-N junction can be determined within certain limits. In any event each P-type gate region 31 extends laterally toward the adjacent P-type gate regions 31 to form channels having a width $d_{gs}$ which can be determined relatively free of the gate-to-source spacing $d_{gs}$ at the surface of the wafer.

Thus, while there has been shown and described what is considered a preferred embodiment of the present invention, it will be obvious to those skilled in the art that various changes and modifications may be made therein without departing from the invention as defined by the appended claims.

What is claimed is:

1. The method of fabricating a junction field effect transistor comprising
   providing a body of semiconductor material including a substrate of semiconductor material of one conductivity type of relatively low resistivity and a layer of semiconductor material of the one conductivity type of relatively high resistivity contiguous said substrate, said layer having a surface at a surface of the body;
   introducing conductivity type imparting material of the one conductivity type into said layer from said surface to form a surface layer of semiconductor material of the one conductivity type of relatively low resistivity adjacent to said surface and an underlying layer of semiconductor material of the one conductivity type of relatively high resistivity between said surface layer and said substrate;
   forming a layer of protective material adherent to said surface;
   removing portions of said layer of protective material to expose alternating gate surface areas and source surface areas in said surface;
   introducing conductivity type imparting material of the opposite conductivity type into said surface and underlying layers from said gate surface areas to produce zones of graded concentration of conductivity type imparting material of the opposite conductivity type with the highest concentration adjacent to said gate surface areas thereby forming gate regions of the opposite conductivity type extending from the gate surface areas for a greater distance into said underlying layer than into said surface layer;
   introducing conductivity type imparting material of the one conductivity type into said surface layer from said source surface areas to produce source regions of the one conductivity type of lower resistivity at said source surface areas; and
   applying conductive material to form source and gate contacts in ohmic contact with said source and gate regions at said source and gate surface areas, respectively, and to form a drain contact with said substrate.

2. The method of fabricating a junction field effect transistor in accordance with claim 1 wherein
   introducing conductivity type imparting material of the opposite conductivity type into said surface and underlying layers includes diffusing conductivity type imparting material of the opposite conductivity type into said zones to provide zones of graded concentration of conductivity type imparting material of the opposite conductivity type.

3. The method of fabricating a junction field effect transistor in accordance with claim 2 wherein
   introducing conductivity type imparting material of the one conductivity type into said layer from said surface to form a surface layer of semiconductor material of the one conductivity type of relatively low resistivity adjacent to said surface includes ion implanting conductivity type imparting material of the one conductivity type into said layer to form said surface layer of substantially uniform concentration of conductivity type imparting material of the one conductivity type.

4. The method of fabricating a junction field effect transistor in accordance with claim 2 wherein
   introducing conductivity type imparting material of the one conductivity type into said layer from said surface to form a surface layer of semiconductor material of the one conductivity type of relatively low resistivity adjacent to said surface includes diffusing conductivity type imparting material of the one conductivity type into said layer to form said surface layer of graded concentration of conductivity type imparting material of the one conductivity type.

5. The method of fabricating a junction field effect transistor comprising provid ing a substrate of semiconductor material of one conductivity type of relatively low resistivity having a flat planar surface;

growing an epitaxial layer of semiconductor material of the one conductivity type of relatively high resistivity on said surface of the substrate, said epitaxial layer having a flat planar surface parallel to the interface of the epitaxial layer and the substrate, said epitaxial layer and said substrate forming a body of semiconductor material;

introducing conductivity type imparting material of the one conductivity type into said epitaxial layer from said surface to form a surface layer of semiconductor material of the one conductivity type of relatively low resistivity adjacent to said surface and an underlying layer of semiconductor material of the one conductivity type of relatively high resistivity between said surface layer and said substrate;

forming a layer of protective material adherent to said surface;

removing portions of said layer of protective material to expose alternating gate surface areas and source surface areas in said surface;

introducing conductivity type imparting material of the opposite conductivity type into said epitaxial layer from said gate surface areas to produce zones of graded concentration of conductivity type imparting material of the opposite conductivity type with the highest concentration adjacent to said gate surface areas thereby forming gate regions of the opposite conductivity type extending from the gate surface areas for a greater distance into said underlying layer of semiconductor material of relatively high resistivity than into said surface layer of semiconductor material of relatively low resistivity;

introducing conductivity type imparting material of the one conductivity type into said surface layer of semiconductor material of the one conductivity type of relatively low resistivity at said source surface areas to produce source regions of the one conductivity type of lower resistivity at said source surface areas; and applying conductive material to form source and gate contacts in ohmic contact with said source and gate regions at said source and gate surface areas, respectively, and to form a drain contact with said substrate.

6. The method of fabricating a junction field effect transistor in accordance with claim 5 wherein introducing conductivity type imparting material of the opposite conductivity type into said epitaxial layer includes diffusing conductivity type imparting material of the opposite conductivity type into said zones to provide zones of graded concentration of conductivity type imparting material of the opposite conductivity type.

7. The method of fabricating a junction field effect transistor in accordance with claim 6 wherein introducing conductivity type imparting material of the one conductivity type into said epitaxial layer from said surface to form a surface layer of semiconductor material of the one conductivity type of relatively low resistivity includes ion implanting conductivity type imparting material of the one conductivity type into said epitaxial layer to form said surface layer of substantially uniform concentration of conductivity type imparting material of the one conductivity type.

8. The method of fabricating a junction field effect transistor in accordance with claim 6 wherein introducing conductivity type imparting material of the one conductivity type into said epitaxial layer from said surface to form a surface layer of semiconductor material of the one conductivity type of relatively low resistivity includes diffusing conductivity type imparting material of the one conductivity type into said epitaxial layer to form said surface layer of graded concentration of conductivity type imparting material of the one conductivity type.

9. The method of fabricating a junction field effect transistor in accordance with claim 6 wherein the semiconductor material is silicon; and the protective material is silicon dioxide.

10. The method of fabricating a junction field effect transistor in accordance with claim 6 wherein the one conductivity type is N-type; and the opposite conductivity type is P-type.

* * * * *